Figure 1:
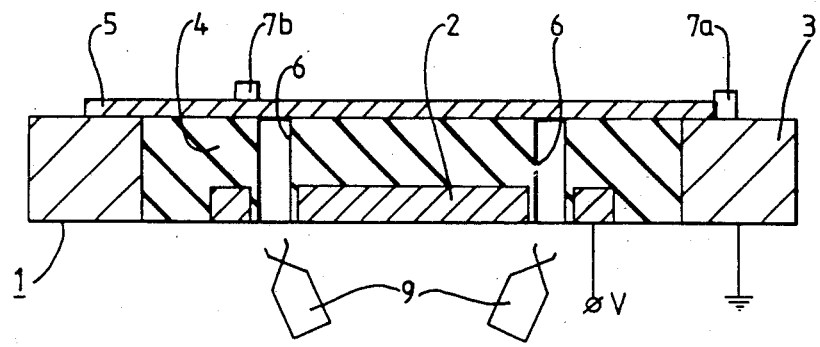

United States Patent

Lewin

[11] Patent Number: 4,554,611
[45] Date of Patent: Nov. 19, 1985

[54] ELECTROSTATIC CHUCK LOADING

[75] Inventor: Ian H. Lewin, Forest Row, England

[73] Assignee: U.S. Philips Corporation, New York, N.Y.

[21] Appl. No.: 645,631

[22] Filed: Aug. 30, 1984

[30] Foreign Application Priority Data

Feb. 10, 1984 [GB] United Kingdom ............... 8403547

[51] Int. Cl.$^4$ ............................................. H01F 13/02
[52] U.S. Cl. ..................................... 361/234; 29/559; 29/900; 361/330
[58] Field of Search .................. 29/559, 900; 361/234, 361/330; 335/289

[56] References Cited

U.S. PATENT DOCUMENTS

| | | | |
|---|---|---|---|
| 3,197,682 | 7/1965 | Klass et al. | 361/234 |
| 3,330,252 | 7/1967 | Oberg | 361/234 X |
| 3,582,730 | 6/1971 | Teston | 361/234 |
| 3,634,740 | 1/1972 | Stenko | 361/234 |
| 3,717,801 | 2/1973 | Silverberg | 361/234 |
| 4,384,918 | 5/1983 | Abe | 361/234 X |
| 4,480,284 | 10/1984 | Tojo et al. | 361/234 |
| 4,502,094 | 2/1985 | Lewin et al. | 361/234 |

FOREIGN PATENT DOCUMENTS 1043298  9/1966  United Kingdom ................ 361/234

Primary Examiner—Charlie T. Moon
Attorney, Agent, or Firm—Paul R. Miller

[57] ABSTRACT

An electrostatic chuck (1) for holding a semiconductor wafer (5) has a dielectric layer (4) on an electrode (2) and surrounded by an annulus (3) for electrically contacting the wafer. The wafer is located on the dielectric layer but at its periphery contacts the annulus. By applying a potential difference (V) from an external voltage source between the annulus and the electrode the wafer is electrostatically clamped against the chuck. The wafer is displaced rotationally, perpendicularly, and/or laterally on the chuck while the voltage is still connected. This enchances the clamping effect due to charge retention in the dielectric layer after the voltage source has been disconnected.

8 Claims, 2 Drawing Figures

ELECTROSTATIC CHUCK LOADING

This invention relates to a method of loading a semiconductor wafer onto an electrostatic chuck.

In the manufacture of semiconductor devices it is sometimes necessary to clamp a semiconductor wafer substantially flat against a support during certain processing treatments. Such a processing treatment involves directing charged particles towards the wafer. For example, selected areas of the wafer can have their conductivity type modified by the implantation of ions. As another example, an electron sensitive resist may be coated on the wafer surface and the resist can then be exposed to a beam of electrons. For these processing treatments it is known to clamp the semiconductor wafer using an electrostatic chuck in the processing apparatus.

Our co-pending (as yet unpublished) United Kingdom Patent Application No. 8326220 (our reference: PHB 33026) filed on Sept. 30, 1983 discloses an electrostatic chuck having a layer of dielectric material on an electrically conductive member, and means for electrically contacting the wafer. In that case the wafer is loaded onto the chuck by locating the wafer on the dielectric layer contiguously to the contact means. An external voltage source is then connected to provide a potential difference between the wafer (via the contact means) and the conductive member whereby the wafer is clamped to the chuck under the action of Coulombic forces. However, when the voltage source is disconnected the wafer remains clamped due to the effect of charge retention in the dielectric. This is a significant advantage over previous electrostatic chucks enabling the semiconductor wafer to remain held on the chuck for handling and transport purposes without the inconvenience of the chuck having to remain connected to an external voltage source and without the need for mechanical retaining means.

While the electrostatic chuck forming the subject of our aforementioned pending patent application is capable of quite satisfactory performance using the wafer loading method described therein and summarized above, the applicants have discovered that the clamping force due only to charge retention in the dielectric (i.e. after disconnecting the external voltage source) tends to be significantly lower than the clamping force which exists when the voltage source is still connected.

According to the present invention a method of loading a semiconductor wafer onto an electrostatic chuck having a layer of dielectric material on an electrically conductive member, and means for electrically contacting the wafer, which method includes the steps of locating the wafer on the dielectric layer contiguously to the contact means, connecting an external voltage source to provide a potential difference between the contact means and the electrically conductive member thereby clamping the wafer to the chuck, and subsequently disconnecting the external voltage source whereupon the wafer remains clamped due to the effect of charge retention in the dielectric, is characterised by the further step of displacing the wafer on the dielectric layer at least after connecting and before disconnecting the external voltage source.

The applicants have found that by displacing the wafer on the chuck while the external voltage source is still connected the residual electrostatic clamping force after disconnecting the voltage source, that is to say the clamping force due to charge retention in the dielectric, can be enhanced several-fold. In fact the applicants were surprised to find that the residual clamping force immediately after disconnecting the external voltage source may be substantially as strong as if the voltage source were still connected.

The wafer may be displaced by separating it from the dielectric layer, by rotating it, by moving it laterally, or a combination of these. This can be achieved manually or mechanically. However, the wafer is less likely to suffer damage if displacement is effected using jets of air directed through ducting means in the chuck. Thus an air jet directed through a single duct orthogonally to the wafer can be used to lift the wafer perpendicularly off the chuck. On the other hand a pair of inclined jets directed respectively through two spaced apart ducts can be used to impart torque and hence rotation to the wafer as well as lifting it from the chuck.

Usually the wafer would be subjected to an initial alignment on the chuck before the external voltage source is connected. In order to preserve this initial alignment as far as possible it is preferable for the wafer to be displaced in an oscillatory manner with a relatively small amplitude of oscillation. A particularly high degree of alignment can be maintained by gradually decreasing the amplitude before the voltage source is disconnected. In this way the wafer returns substantially to its undisturbed, i.e. initially aligned, position before finally being clamped in a specific orientation.

Preferably, the conductive member is shorted to the contact means as the external voltage source is disconnected. This has been found to be beneficial on two counts. Firstly, it appears to promote charge retention in the dielectric resulting in firmer wafer clamping. Secondly, it prevents discharge which would otherwise occur when the loaded chuck is used in a vacuum chamber because the residual gas in the chamber goes through a conductive phase during evacuation. Discharge is undesirable because the residual clamping force is temporarily reduced and consequently the wafer alignment may be disturbed.

Figure 2:
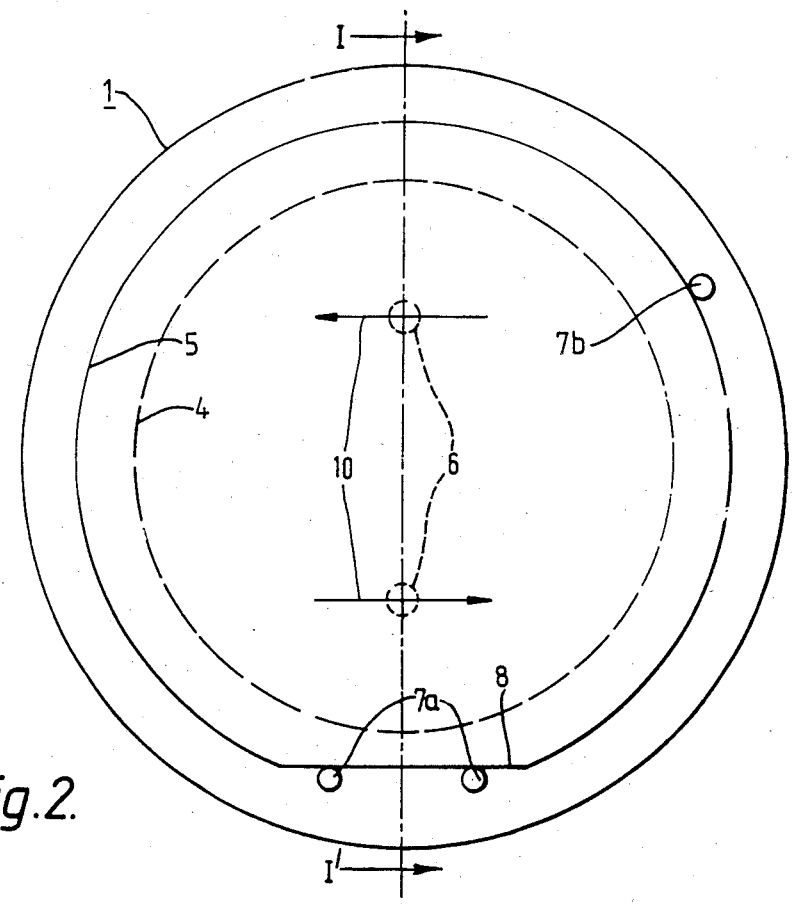

An embodiment of the invention will now be described, by way of example, with reference to the accompanying drawing in which FIG. 1 is a cross-section taken on the line I—I' of FIG. 2 of a semiconductor wafer loaded on an electrostatic chuck by a method in accordance with the invention, and FIG. 2 is a plan view of the chuck and wafer of FIG. 1.

It is noted that, for the sake of clarity, the drawing is not to scale.

The electrostatic chuck 1 comprises an electrically conductive member in the form of a circular aluminium plate 2 which is 92 mm in diameter and 5.3 mm thick. Plate 2 is surrounded by contact means in the form of an aluminium annulus 3 having an external diameter of 150 mm and an internal diameter of 96 mm. The thickness of annulus 3 is 5.5 mm. Plate 2 is centrally disposed with respect to annulus 3. The space between the plate 2 and the annulus 3 is filled with epoxy resin, preferably loaded with particulate alumina or mica. A suitable loaded epoxy which is capable of charge retention is commercially available from Messrs. Emerson and Cuming, Canton, Mass., U.S.A. under the trade mark Stycast 2651. Above the plate 2 the epoxy resin is filled to the level of the annulus 3 to form a dielectric layer 4. The thickness of dielectric layer 4 is approximately 200 micrometers. The upwardly directed surface of the dielectric layer 4 and the annulus 5 is made flat to within approximately ±5 micrometers by super finishing.

Ducting means in the form of two 8 mm diameter apertures 6 each with a circular cross section and spaced apart by approximately 70 mm extend through the full thickness of the dielectric layer 4 and the plate 2. The dielectric layer 4 extends down the flanks of the apertures 6 in the plate 2 to a radial thickness of approximately 0.5 mm.

A 4 inch diameter semiconductor wafer 5 having a conventional flat edge 8 is located centrally on the chuck on the major surface remote from the electrically conductive plate 2. The wafer 5 may be introduced on a cushion of air in known manner. The flat edge 8a of the wafer abuts two location pegs 7a and the curved edge 8b abuts a third location peg 7b provided on the annulus 3. Thus the wafer 5 is initially aligned on the chuck with a specific orientation.

For the major part the wafer 5 rests on the dielectric layer 4, but at the periphery it is contiguous to and hence makes electrical contact with the annulus 3.

After locating the wafer on the chuck 1 as described above, an external voltage source is connected to provide a potential difference V typically of 3.5 kV between the annulus 3 and the conductive plate 2. To this end the annulus 3 may be earthed and a voltage source of −3.5 kV connected to the plate 2. Because the wafer 5 is in electrical contact with the annulus 3 a potential difference V is established between the wafer 5 and the conductive plate 2 across the dielectric layer 4. This results in the wafer 5 being clamped firmly against the chuck 1 under the action of Coulombic forces.

Before disconnecting the voltage source the wafer 5 is displaced using jets of air from two supply nozzles 9 directed respectively through the two apertures 6 in the chuck 1. The supply nozzles are inclined to the longitudinal axis of the apertures 6, for examle by 10°, in order to provide a lateral and a vertical component of force. The inclination of the air jets is such that the lateral components of force are oppositely directed as represented by the arrows 10 so as to impart torque and hence rotation to the wafer. The location pegs 7a, 7b act to restrain the wafer 5 from revolving to any significant extent. Also, the vertical component of force acts to lift the wafer hence separating it from the dielectric layer. The air jets are pulsed at a rate of 1-2/sec. Thus the wafer 5 is displaced in an oscillatory manner both as it rises and falls on the chuck 1 and as it gently rattles in an attempt to revolve against the constraint of the location pegs 7a, 7b. Preferably the force of the air jets is gradually reduced so that the amplitude of oscillation gradually decreases. In this way the wafer 5 is allowed to return to its previously aligned, undisturbed position abutting the location pegs 7a, 7b before finally being clamped in a specific orientation.

The air jet pulsing may continue for approximately 3-4 second. When it is stopped the wafer becomes stationary and the external voltage source is disconnected. The wafer 5 remains clamped to the chuck 1 more firmly than it would have been if the wafer had not been displaced while the external voltage source was connected. Thus the wafer can be transported on the chuck without the need for an external voltage source and without the fear that wafer alignment may be lost because of insufficient residual clamping force.

Preferably the conductive plate 2 is shorted to the annulus 3 as the external voltage source is disconnected. As mentioned previously, this has been found to prevent the chuck discharging in a vacuum chamber. It is desirable that the chuck should be capable of use in a vacuum chamber because it is under vacuum conditions that certain wafer processing treatments, e.g. using electron lithography, are carried out. Under evacuation there is the problem of discharge and the consequential temporary reduction of electrostatic attraction accompanied by the possible loss of wafer alignment. The expedient of discharging the chuck under normal pressure as the voltage source is disconnected not only avoids this problem but also appears to promote charge retention in the dielectric hence optimizing the residual clamping force.

The Applicants have found that the residual charge leaks away slowly allowing the wafer to be removed after about 48 hours. Usually, however, more immediate removal is required. Although mechanical removal is possible it is preferable to use jets of air directed from the back side of the chuck 1, i.e. the side remote from the wafer 5, through the apertures 6 to lift the wafer slightly off the chuck. The wafer 5 can then be floated laterally away from the chuck on a cushion of air directed across the front surface of the chuck or the chuck can be tilted for the wafer simply to slide off.

In the light of the above description it will be evident that many modifications may be made within the scope of the present invention. For example displacement of the wafer may be commenced before the external voltage source is connected. Moreover, if alignment is not critical the wafer may be displaced only by separating it from the dielectric layer without rotation. In this case only a single, vertically directed, air jet may be used which can be ducted through a centrally disposed aperture in the chuck. On the other hand the wafer may be rotated or moved laterally on the chuck without purposely separating it from the dielectric layer. This may be effected mechanically or simply by hand.

I claim:

1. A method of loading a semiconductor wafer onto an electrostatic chuck having a layer of dielectric material on an electrically conductive member, and means for electrically contacting the wafer, which method includes the steps of locating the wafer on the dielectric layer contiguously to the contact means, connecting an external voltage source to provide a potential difference between the contact mens and the electrically conductive member thereby clamping the wafer to the chuck, and subsequently disconnecting the external voltage source whereupon the wafer remains clamped due to the effect of charge retention in the dielectric, characterised by the further step of displacing the wafer on the dielectric layer at least after connecting and before disconnecting the external voltage source.

2. A method as claimed in claim 1, characterised in that the displacement comprises separating the wafer from the dielectric layer.

3. A method as claimed in either of the preceding claims, characterised in that the displacement comprises rotating the wafer.

4. A method as claimed in any one the preceding claims, characterised in that the displacement comprises moving the wafer laterally on the chuck.

5. A method as claimed in any one the preceding claims, characterised in that the wafer is displaced in an oscillatory manner.

6. A method as claimed in claim 5, characterised in that the amplitude of the oscillatory displacement is gradually decreased before the external voltage source is disconnected.

7. A method as claimed in any one the preceding claims, characterised in that the displacement is effected by at least one air jet directed at the wafer through ducting means in the chuck.

8. A method as claimed in any one the preceding claims, characterised in that after disconnecting the external voltage source the conductive member is shorted to the contact means.

* * * * *